(12) United States Patent
Sapozhnik et al.

(10) Patent No.: US 11,614,804 B2
(45) Date of Patent: Mar. 28, 2023

(54) METHOD FOR PROVIDING THREE DIMENSIONAL INPUT AND ELECTRONIC DEVICE SUPPORTING THE SAME

(71) Applicant: Samsung Electronics Co., Ltd., Suwon-si (KR)

(72) Inventors: Oleksandr Sapozhnik, Kyiv (UA); Iegor Vdovychenko, Kyiv (UA); Andrii Bugaiov, Kyiv (UA)

(73) Assignee: Samsung Electronics Co., Ltd., Suwon-si (KR)

( * ) Notice: Subject to any disclaimer, the term of this patent is extended or adjusted under 35 U.S.C. 154(b) by 234 days.

(21) Appl. No.: 17/147,959

(22) Filed: Jan. 13, 2021

(65) Prior Publication Data
US 2022/0066565 A1   Mar. 3, 2022

(30) Foreign Application Priority Data

Aug. 31, 2020  (KR) .................. 10-2020-0110532

(51) Int. Cl.
| | | |
|---|---|---|
| *G06F 3/01* | (2006.01) | |
| *H04B 10/90* | (2013.01) | |
| *H04B 10/69* | (2013.01) | |
| *H04B 10/50* | (2013.01) | |
| *H04B 1/709* | (2011.01) | |

(Continued)

(52) U.S. Cl.
CPC .............. *G06F 3/017* (2013.01); *G01R 33/02* (2013.01); *G01R 33/24* (2013.01); *G06F 3/011* (2013.01); *H04B 1/709* (2013.01); *H04B 10/50* (2013.01); *H04B 10/69* (2013.01); *H04B 10/90* (2013.01)

(58) Field of Classification Search
None
See application file for complete search history.

(56) References Cited

U.S. PATENT DOCUMENTS

| | | |
|---|---|---|
| 9,524,628 B1 | 12/2016 | Omer et al. |
| 10,180,721 B2 | 1/2019 | Hoen et al. |
| 2011/0267042 A1 | 11/2011 | Sano et al. |

(Continued)

FOREIGN PATENT DOCUMENTS

KR   10-2018-0005070 A   1/2018

OTHER PUBLICATIONS

International Search Report dated May 25, 2021, issued in International Application No. PCT/KR2021/000045.

(Continued)

*Primary Examiner* — Douglas X Rodriguez
(74) *Attorney, Agent, or Firm* — Jefferson IP Law, LLP

(57) ABSTRACT

An electronic device is provided. The electronic device includes a memory and at least one processor functionally connected with the memory, wherein the at least one processor may be configured to generate a first signal by modulating a phase of a default signal using a first code corresponding to a first magnetic field generator connected with the electronic device, control the first magnetic field generator connected with the electronic device to radiate a magnetic field corresponding to the first signal, receive a signal from at least one sensor connected with the electronic device, identify a second signal corresponding to the first signal from the signal, using the first code, and determine at least one of a position or a direction of the at least one sensor based on the second signal.

2 Claims, 12 Drawing Sheets

(51) Int. Cl.
*G01R 33/02* (2006.01)
*G01R 33/24* (2006.01)

(56) References Cited

U.S. PATENT DOCUMENTS

| | | |
|---|---|---|
| 2012/0025945 A1 | 2/2012 | Yazadi et al. |
| 2016/0011285 A1 | 1/2016 | Griswold et al. |
| 2016/0246369 A1 | 8/2016 | Osman |
| 2017/0185160 A1 | 6/2017 | Cho et al. |
| 2018/0011597 A1 | 1/2018 | Lee et al. |
| 2018/0070816 A1 | 3/2018 | Byrns et al. |
| 2018/0081436 A1 | 3/2018 | Keller et al. |
| 2018/0302259 A1 | 10/2018 | Vdovychenko et al. |
| 2019/0265017 A1 | 8/2019 | Guo et al. |
| 2019/0282892 A1 | 9/2019 | Miyaki |
| 2019/0317607 A1* | 10/2019 | Lin .................. G06F 3/017 |
| 2021/0341279 A1* | 11/2021 | Eskildsen .......... G01R 33/0017 |

OTHER PUBLICATIONS

Bezdicek et al., Portable Absolute Position Tracking System for Human Hand Fingertips, Dec. 1, 2006, Proceedings of Virtual Concept 2006, Cancún, Mexico.

Maclachlan et al., Electromagnetic Tracker for Active Handheld Robotic Systems, 2016, Proc IEEE Sens. 2016.

Perez et al., VR EM Motion Tracking Sensors & Applications, Dec. 2017.

Fels et al., Glove-Talk: A Neural Network Interface Between a Data-Glove and a Speech Synthesizer, Nov. 6, 1992, IEEE Transactions on Neural Networks, vol. 3, No. 6.

Tech Note: Understanding Cable Stress and Failure in High Flex Applications, Oct. 2020.

NDI's 3D Guidance trakSTAR Equipment.

NDI's 3D Guidance trakSTAR Sensors.

* cited by examiner

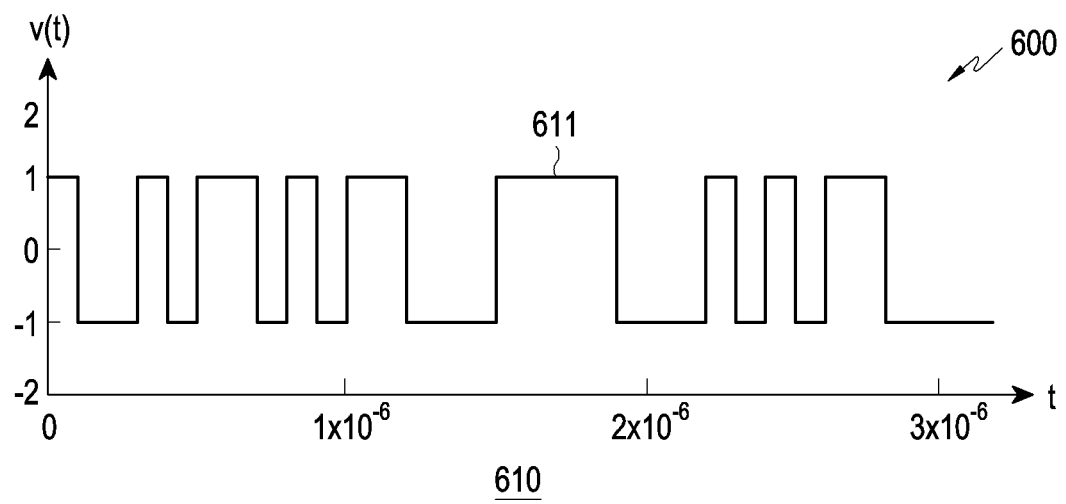
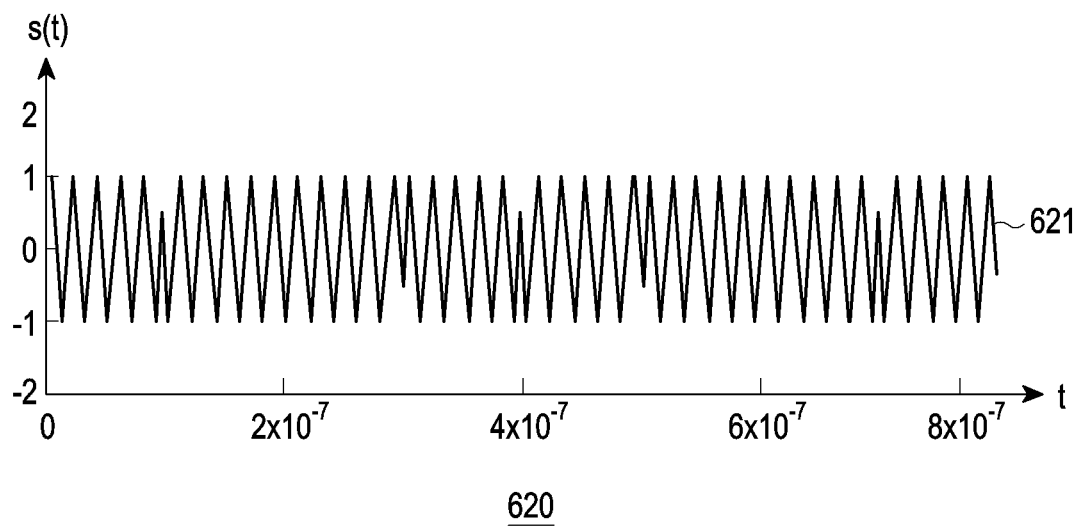
FIG.6

METHOD FOR PROVIDING THREE DIMENSIONAL INPUT AND ELECTRONIC DEVICE SUPPORTING THE SAME

CROSS-REFERENCE TO RELATED APPLICATION(S)

This application is based on and claims priority under 35 U.S.C. § 119(a) of a Korean patent application number 10-2020-0110532, filed on Aug. 31, 2020, in the Korean Intellectual Property Office, the disclosure of which is incorporated by reference herein in its entirety.

BACKGROUND

1. Field

The disclosure relates to methods for providing three-dimensional (3D) input and electronic devices supporting the same.

2. Description of Related Art

An electronic device may perform various functions by detecting the user's gesture. An electronic device may detect the movement of the user's hand based on an image for the user's hand (or finger) obtained via the camera. An electronic device may perform various functions according to the movement of the user's hand.

For example, an electronic device (e.g., an augmented reality (AR) device or a virtual reality (VR) device) may detect the movement of the user's hand based on an image obtained via the camera while providing video using augmented reality or virtual reality. An electronic device may perform various functions related to the provided image based on the movement of the user's hand.

The above information is presented as background information only to assist with an understanding of the disclosure. No determination has been made, and no assertion is made, as to whether any of the above might be applicable as prior art with regard to the disclosure.

SUMMARY

An electronic device may fail to precisely detect the user's gesture upon detecting the user's gesture based on the image obtained via the camera. For example, when the user's fingers are hidden by other object or the camera is severely shaken, the electronic device may not detect the movement of the user's fingers based on the image obtained via the camera.

Aspects of the disclosure are to address at least the above-mentioned problems and/or disadvantages and to provide at least the advantages described below. Accordingly, an aspect of the disclosure is to provide a method for providing three-dimensional (3D) input, which may detect the movement of an object (e.g., the user's finger) in a 3D space and provide information about the detected object movement as input to another electronic device, and an electronic device supporting the method.

Aspects of the disclosure are not limited to the foregoing, and other unmentioned aspects would be apparent to one of ordinary skill in the art from the following description.

Additional aspects will be set forth in part in the description which follows and, in part, will be apparent from the description, or may be learned by practice of the presented embodiments.

In accordance with an aspect of the disclosure, an electronic device is provided. The electronic device includes a memory and at least one processor functionally connected with the memory, wherein the at least one processor may be configured to generate a first signal by modulating a phase of a default signal using a first code corresponding to a first magnetic field generator connected with the electronic device, control the first magnetic field generator connected with the electronic device to radiate a magnetic field corresponding to the first signal, receive a signal from at least one sensor connected with the electronic device, identify a second signal corresponding to the first signal from the signal, using the first code, and determine at least one of a position or a direction of the at least one sensor based on the second signal.

In accordance with another aspect of the disclosure, a method for providing three-dimensional (3D) input by an electronic device is provided. The method includes generating a first signal by modulating a phase of a default signal using a first code corresponding to a first magnetic field generator connected with the electronic device, controlling the first magnetic field generator connected with the electronic device to radiate a magnetic field corresponding to the first signal, receiving a signal from at least one sensor connected with the electronic device, identifying a second signal corresponding to the first signal from the signal, using the first code, and determining at least one of a position or a direction of the at least one sensor based on the second signal.

In accordance with another aspect of the disclosure, an electronic device is provided. The electronic device includes a memory and at least one processor functionally connected with the memory, wherein the at least one processor may be configured to generate a plurality of first signals by modulating a phase of a default signal using a plurality of first codes individually corresponding to a plurality of first sensors connected with the electronic device, control a magnetic field generator connected with the electronic device to radiate a plurality of magnetic fields corresponding to the plurality of first signals, receive a plurality of second signals from the plurality of sensors, identify the plurality of second signals using the plurality of first codes, and determine at least one of a position or a direction of each of the plurality of sensors based on the plurality of second signals.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features and advantages of certain embodiments of the disclosure will be more apparent from the following description taken in conjunction with the accompanying drawings, in which:

FIG. 6 is a view illustrating a code and a first signal according to an embodiment of the disclosure;

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
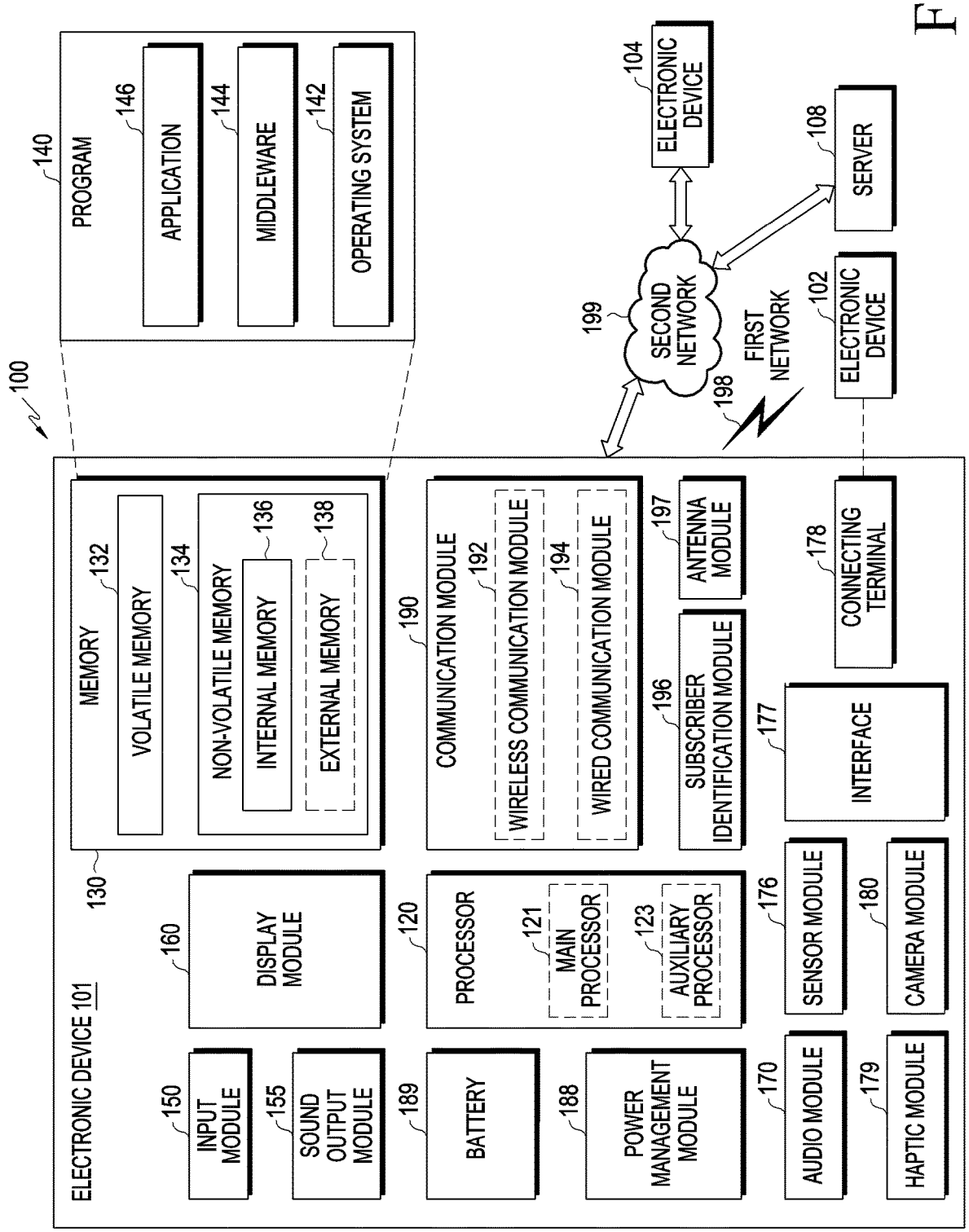
FIG. 1 is a view illustrating an electronic device in a network environment according to an embodiment of the disclosure.

FIG. 1 is a block diagram illustrating an electronic device 101 in a network environment 100 according to an embodiment of the disclosure.

Referring to FIG. 1, the electronic device 101 in the network environment 100 may communicate with an external electronic device 102 via a first network 198 (e.g., a short-range wireless communication network), or an external electronic device 104 or a server 108 via a second network 199 (e.g., a long-range wireless communication network). According to an embodiment of the disclosure, the electronic device 101 may communicate with the external electronic device 104 via the server 108. According to an embodiment of the disclosure, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments of the disclosure, at least one (e.g., the connecting terminal 178) of the components may be omitted from the electronic device 101, or one or more other components may be added in the electronic device 101. According to an embodiment of the disclosure, some (e.g., the sensor module 176, the camera module 180, or the antenna module 197) of the components may be integrated into a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment of the disclosure, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment of the disclosure, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use lower power than the main processor 121 or to be specified for a designated function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment of the disclosure, the auxiliary processor 123 (e.g., an image signal processor or a communication processor) may be implemented as part of another component (e.g., the camera module 180 or the communication module 190) functionally related to the auxiliary processor 123. According to an embodiment of the disclosure, the auxiliary processor 123 (e.g., the neural processing unit) may include a hardware structure specified for artificial intelligence model processing. The artificial intelligence model may be generated via machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by other component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment of the disclosure, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment of the disclosure, the display module 160 may include a touch sensor configured to detect a touch, or a pressure sensor configured to measure the intensity of a force generated by the touch.

The audio module 170 may convert a sound into an electrical signal and vice versa. According to an embodiment of the disclosure, the audio module 170 may obtain the sound via the input module 150, or output the sound via the sound output module 155 or a headphone of an external electronic device (e.g., an external electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment of the disclosure, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the external electronic device 102) directly (e.g., wiredly) or wirelessly. According to an embodiment of the disclosure, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the external electronic device 102). According to an embodiment of the disclosure, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment of the disclosure, the haptic module 179 may include, for example, a motor, a piezoelectric element, or an electric stimulator.

The camera module 180 may capture a still image or moving images. According to an embodiment of the disclosure, the camera module 180 may include one or more lenses, image sensors, image signal processors, or flashes.

The power management module 188 may manage power supplied to the electronic device 101. According to one embodiment of the disclosure, the power management module 188 may be implemented as at least part of, for example, a power management integrated circuit (PMIC).

The battery 189 may supply power to at least one component of the electronic device 101. According to an embodiment of the disclosure, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the external electronic device 102, the external electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment of the disclosure, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a 5G network, a next-generation communication network, the Internet, or a computer network (e.g., local area network (LAN) or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the millimeter (mm) Wave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the external electronic device 104), or a network system (e.g., the second network 199). According to an embodiment of the disclosure, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device). According to an embodiment of the disclosure, the antenna module 197 may include one antenna including a radiator formed of a conductor or conductive pattern formed on a substrate (e.g., a printed circuit board (PCB)). According to an embodiment of the disclosure, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment of the disclosure, other parts (e.g., radio frequency integrated circuit (RFIC)) than the radiator may be further formed as part of the antenna module 197.

According to various embodiments of the disclosure, the antenna module 197 may form a mmWave antenna module. According to an embodiment of the disclosure, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment of the disclosure, instructions or data may be transmitted or received between the electronic device 101 and the external electronic device 104 via the server 108 coupled with the second network 199. The external electronic devices 102 or 104 each may be a device of the same or a different type from the electronic device 101. According to an embodiment of the disclosure, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra-low-latency services using, e.g., distributed computing or mobile edge computing. In another embodiment of the disclosure, the external electronic device 104 may include an internet-of-things (IoT) device. The server 108 may be an intelligent server using machine learning and/or a neural network. According to an embodiment of the disclosure, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment of the disclosure, a method according to various embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments of the disclosure, each component (e.g., a module or a program) of the above-described components may include a single entity or multiple entities. Some of the plurality of entities may be separately disposed in different components. According to various embodiments of the disclosure, one or more of the above-described components may be omitted, or one or more other components may be added. Alternatively or additionally, a plurality of components (e.g., modules or programs) may be integrated into a single component. In such a case, according to various embodiments of the disclosure, the integrated component may still perform one or more functions of each of the plurality of components in the same or similar manner as they are performed by a corresponding one of the plurality of components before the integration. According to various embodiments of the disclosure, operations performed by the module, the program, or another component may be carried out sequentially, in parallel, repeatedly, or heuristically, or one or more of the operations may be executed in a different order or omitted, or one or more other operations may be added.

Figure 2:
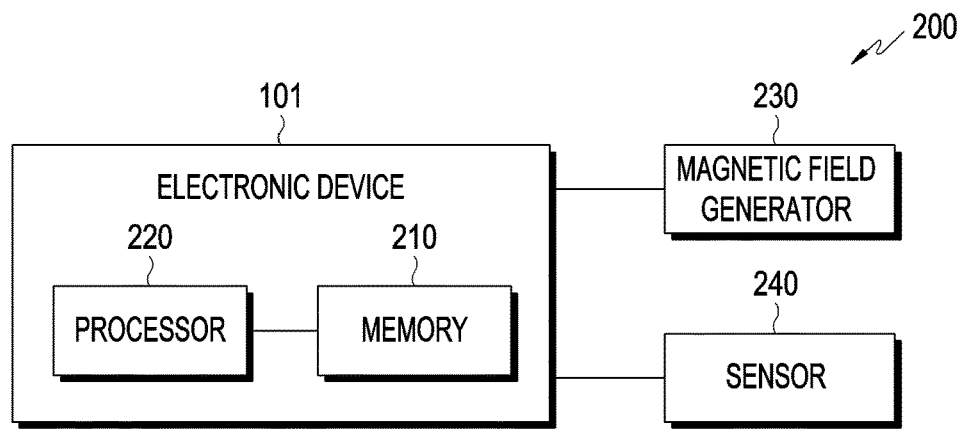
FIG. 2 is a view illustrating a system for providing 3D input according to an embodiment of the disclosure.

FIG. 2 is a view 200 illustrating a system for providing 3D input according to an embodiment of the disclosure.

Figure 3:
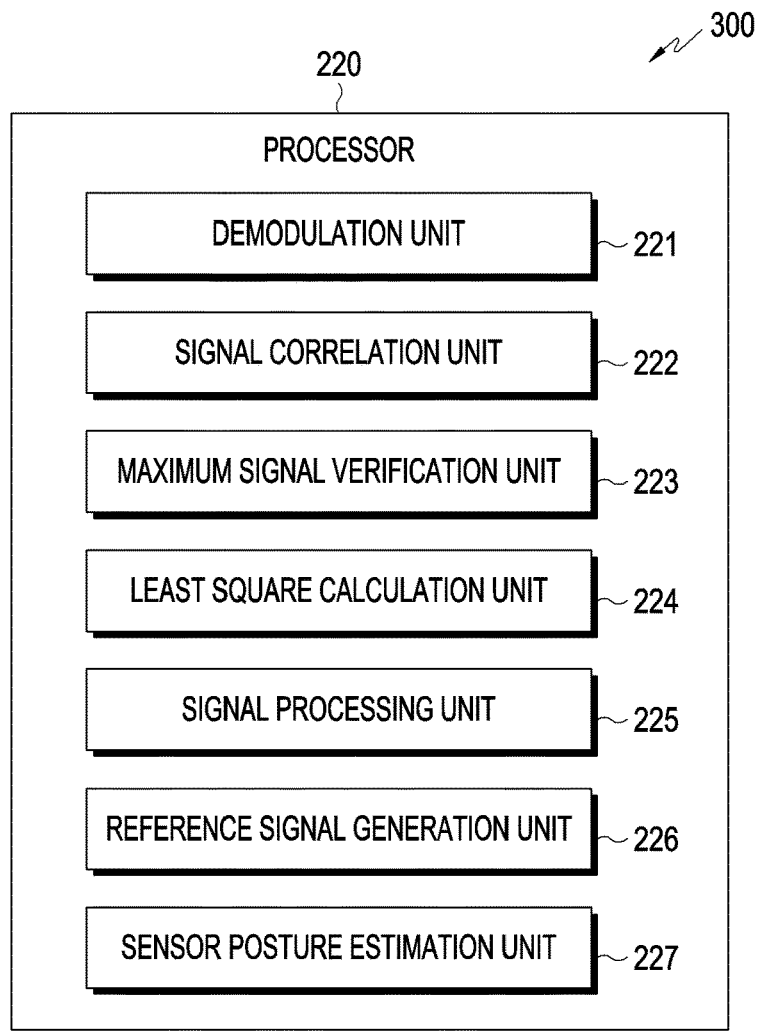
FIG. 3 is a view illustrating a processor according to an embodiment of the disclosure.

FIG. 3 is a view 300 illustrating a processor according to an embodiment of the disclosure.

Referring to FIGS. 2 and 3, according to various embodiments of the disclosure, a system for providing three-dimensional (3D) input may include an electronic device 101, a magnetic field generator 230, and a sensor 240.

According to an embodiment of the disclosure, the magnetic field generator 230 may be wiredly connected with the electronic device 101. According to an embodiment of the disclosure, the magnetic field generator 230 may be connected with the electronic device 101 via a cable. However, without limitations thereto, the magnetic field generator 230 may be wirelessly connected with the electronic device 101.

According to an embodiment of the disclosure, the magnetic field generator 230 may include three coils (or inductors) orthogonal to one another. According to an embodiment of the disclosure, each of the three coils orthogonal to one another, included in the magnetic field generator 230, may generate a magnetic field along the axis of the coil, based on the control signal received from the electronic device 101. According to an embodiment of the disclosure, when there are provided a plurality of magnetic field generators 230, each of the plurality of magnetic field generators 230 may include three coils orthogonal to one another.

According to an embodiment of the disclosure, the sensor 240 may be wiredly connected with the electronic device 101. For example, the sensor 240 may be connected with the electronic device 101 via a cable. However, without limitations thereto, the sensor 240 may be wirelessly connected with the electronic device 101.

According to an embodiment of the disclosure, as the sensor 240 receives the magnetic field generated from the magnetic field generator 230, the sensor 240 may generate a magnetic field-related signal (or a magnetic field-related parameter). For example, the sensor 240 may generate a voltage (or current) induced by the magnetic field generated from the magnetic field generator 230. The sensor 240 may transfer the generated, induced voltage to the electronic device 101.

According to an embodiment of the disclosure, the sensor 240 may include three coils orthogonal to one another. According to an embodiment of the disclosure, when there are provided a plurality of sensors 240, each of the plurality of sensors may include three coils orthogonal to one another.

According to an embodiment of the disclosure, the electronic device 101 may include a memory 210 and a processor 220.

According to an embodiment of the disclosure, the memory 210 may store the code corresponding to the magnetic field generator 230. For example, when there are provided a plurality of magnetic field generators 230, the memory 210 may include a plurality of codes individually assigned to (or corresponding to) the plurality of magnetic field generators.

According to an embodiment of the disclosure, the code may denote a pseudo-random sequence used to modulate a signal in a direct sequence spread spectrum (DSSS) scheme.

According to an embodiment of the disclosure, the memory 210 may store the code corresponding to the sensor 240. For example, when there are provided a plurality of sensors 240, the memory 210 may store a plurality of codes individually corresponding to the plurality of sensors.

According to an embodiment of the disclosure, the code may be generated by the processor 220 or may be received from an external electronic device and be stored in the memory 210. According to an embodiment of the disclosure, the code may be generated in real-time by the processor 220.

According to an embodiment of the disclosure, the memory 210 may be included in the memory 130 of FIG. 1.

According to an embodiment of the disclosure, the processor 220 may include at least one of a demodulation unit 221, a signal correlation unit 222, a maximum signal verification unit 223, a least square calculation unit 224, a signal processing unit 225, a reference signal generation unit 226, or a sensor posture estimation unit 227.

According to an embodiment of the disclosure, the demodulation unit 221 may demodulate the magnetic field-related signal received from the sensor 240. According to an embodiment of the disclosure, the demodulation unit 221 may perform quadrature demodulation on the magnetic field-related signal received from the sensor 240. For example, the demodulation unit 221 may divide the magnetic field-related signal received from the sensor 240 into an in-phase (I) channel signal and a quadrature (Q) channel signal. The demodulation unit 221 may transfer the I channel signal and the Q channel signal to the signal correlation unit 222. Although FIG. 3 illustrates that the demodulation unit 221 is a component independent from the reference signal generation unit 226, the demodulation unit 221 may be included in the reference signal generation unit 226, according to an embodiment.

According to an embodiment of the disclosure, the signal correlation unit 222 may obtain a correlation value between the signal received from the demodulation unit 221 and the signal received from the reference signal generation unit 226. The correlation value may be a value indicating the similarity between the signal received from the demodulation unit 221 and the signal received from the reference signal generation unit 226, which is obtained via cross correlation between the signal received from the demodulation unit 221 and the signal received from the reference signal generation unit 226.

According to an embodiment of the disclosure, the signal correlation unit 222 may accumulate cross correlation values, thereby removing noise for a desired signal. According to an embodiment of the disclosure, the signal correlation unit 222 may include a filter controlling narrow band interference.

According to an embodiment of the disclosure, the maximum signal verification unit 223 may identify the time values of the correlation values, which are not less than a predetermined value (or threshold value), among the correlation values obtained by the signal correlation unit 222. The maximum signal verification unit 223 may transfer the identified time value to the least square calculation unit 224.

According to an embodiment of the disclosure, the least square calculation unit 224 may obtain at least one of the magnitude or phase of the frequency based on the identified time value. For example, the least square calculation unit 224 may obtain at least one of the magnitude or phase of the magnetic field-related signal using a lease square method.

According to an embodiment of the disclosure, the signal processing unit 225 may process at least one of the magnitude or phase of frequency obtained from the least square calculation unit 224. According to an embodiment of the disclosure, when the magnetic field-related signal is a desired signal (e.g., true signal), the signal processing unit 225 may process the magnetic field-related signal based on at least one of the obtained magnitude or phase of frequency.

According to an embodiment of the disclosure, the sensor posture estimation unit 227 may obtain information about the position and direction of the sensor 240, based on the magnetic field-related signal. For example, the sensor posture estimation unit 227 may provide 6 degrees of freedom (DOF) information including the direction and distance between the sensor 240 and the magnetic field generator 230, based on the magnetic field-related signal induced by the sensor 240.

According to an embodiment of the disclosure, the processor 220 may overall control the operation of providing 3D input.

According to an embodiment of the disclosure, the processor 220 may provide 3D input based on the code corresponding to the magnetic field generator 230 connected with the electronic device 101. A method for providing 3D input based on the code corresponding to the magnetic field generator 230 is described below with reference to FIG. 4.

Figure 4:
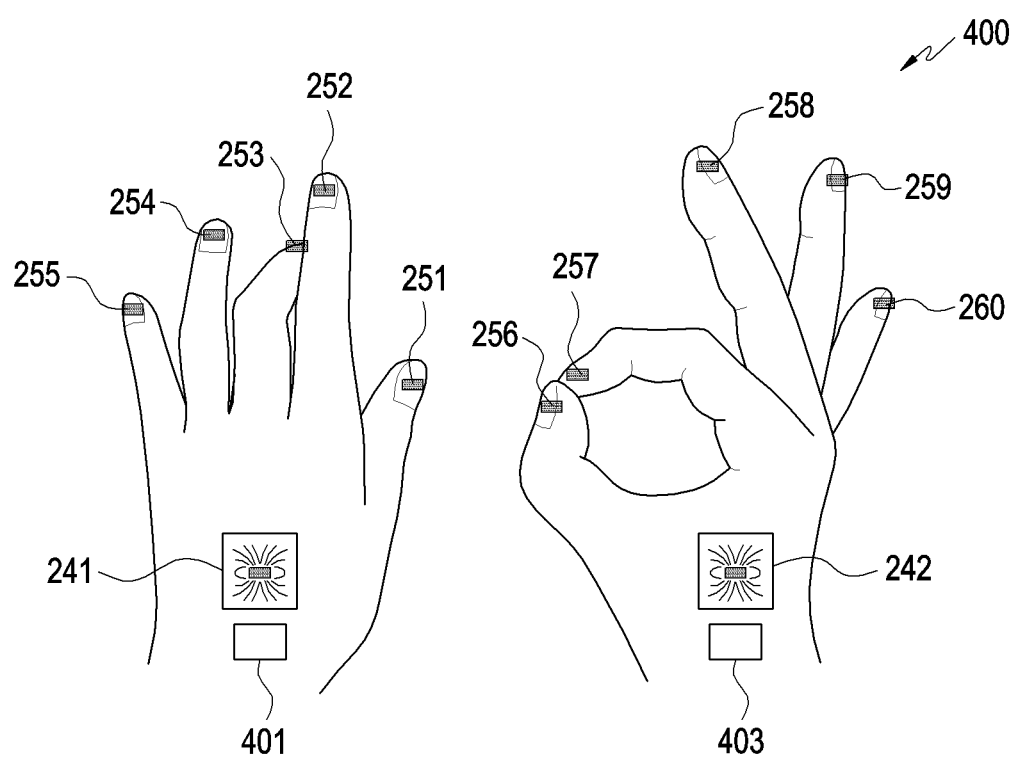
FIG. 4 is a view illustrating a method for providing 3D input according to an embodiment of the disclosure.

FIG. 4 is a view 400 illustrating a method for providing 3D input according to an embodiment of the disclosure.

Referring to FIG. 4, according to an embodiment of the disclosure, a first electronic device 401, a first magnetic field generator 241, and a plurality of first sensors 251 to 255 may be attached to the user's left hand. The first magnetic field generator 241 and the plurality of first sensors 251 to 255 may be connected with the first electronic device 401. According to an embodiment of the disclosure, a second electronic device 403, a second magnetic field generator 242, and a plurality of second sensors 256 to 260 may be attached to the user's right hand. The second magnetic field generator 242 and the plurality of second sensors 256 to 260 may be connected with the second electronic device 403. Although FIG. 4 illustrates that the first electronic device 401, the first magnetic field generator 241, and the plurality of first sensors 251 to 255 are attached to the user's left hand, and the second electronic device 403, the second magnetic field generator 242, and the plurality of second sensors 256 to 260 are attached to the user's right hand, embodiments of the disclosure are not limited thereto. For example, the first electronic device 401, the first magnetic field generator 241, and the plurality of first sensors 251 to 255 may be included in, or mounted on, a first glove worn on the user's left hand. As another example, the second electronic device 403, the second magnetic field generator 242, and the plurality of second sensors 256 to 260 may be included in, or mounted on, a second glove worn on the user's left hand.

According to an embodiment of the disclosure, the first electronic device 401 and the second electronic device 403 each may be identical to the electronic device 101. According to an embodiment of the disclosure, the first magnetic field generator 241 and the second magnetic field generator 242 each may be identical to the magnetic field generator 230. According to an embodiment of the disclosure, each of the plurality of first sensors 251 to 255 and the plurality of second sensors 256 to 260 may be identical to the sensor 240.

For ease of description, the signal generated by modulating the phase of a default signal is denoted a 'first signal,' and the signal generated from the sensor 240 by the first signal is denoted a 'second signal.'

According to an embodiment of the disclosure, the first electronic device 401 may generate a first-first signal by modulating the phase of the default signal using a first code corresponding to the first magnetic field generator 241. For example, the first electronic device 401 (e.g., a reference signal generation unit) may modulate the phase of the default signal (e.g., a signal of harmonic oscillation), using a binary phase shift keying (BPSK) scheme using the first code (pseudo-random sequence) ('10101001') (a code unique to the first magnetic field generator 241). For example, the first electronic device 401 may shift (or transition) the phase of the default signal for the bits of '1' of the first code by π(180°) and shift (or transition) the phase of the default signal for the bits of '0' of the code by −π(−180°).

According to an embodiment of the disclosure, the second electronic device 403 may generate a first-second signal by modulating the phase of the default signal using a second code corresponding to the second magnetic field generator 242. For example, the second electronic device 403 may modulate the phase of the default signal using a BPSK scheme using a second code ('11101001') (e.g., a code unique to the second magnetic field generator 242) different from the first code. For example, the second electronic device 403 may shift the phase of the default signal for the bits of '1' of the second code by π(180°) and shift the phase of the default signal for the bits of '0' of the code by −π(−180°).

According to an embodiment of the disclosure, the first electronic device 401 may control the first magnetic field generator 241 to generate a first magnetic field corresponding to the first-first signal generated by the first electronic device 401. The second electronic device 403 may control the second magnetic field generator 242 to generate a second magnetic field corresponding to the first-second signal generated by the second electronic device 403.

According to an embodiment of the disclosure, the first magnetic field generator 241 and the second magnetic field generator 242 may simultaneously generate the first magnetic field and the second magnetic field. For example, the first magnetic field generator 241 and the second magnetic field generator 242 may enable the first magnetic field and the second magnetic field to be formed simultaneously. However, embodiments of the disclosure are not limited thereto. For example, the first magnetic field generator 241 and the second magnetic field generator 242 may sequentially generate the first magnetic field and the second magnetic field.

According to an embodiment of the disclosure, each of the plurality of first sensors 251 to 255 and each of the plurality of second sensors 256 to 260 may transfer a magnetic field-related second signal generated (or induced) by the first magnetic field and the second magnetic field to the first electronic device 401 and the second electronic device 403. For example, each of the plurality of first sensors 251 to 255 may transfer the second-first signal generated by the first magnetic field and the second-second signal generated by the second magnetic field to the first electronic device 401. Each of the plurality of second sensors 256 to 260 may transfer the second-third signal generated by the first magnetic field and the second-fourth signal generated by the second magnetic field to the second electronic device 403.

According to an embodiment of the disclosure, the first electronic device 401 may detect the second-first signal among the second-first signal and the second-second signal received from each of the plurality of first sensors 251 to 255, using the first code. According to an embodiment of the disclosure, the first electronic device 401 may detect the second-first signal (e.g., the second-first signal generated by the first-first signal) corresponding to the first-first signal generated by the first magnetic field generator 241 among the second-first signal and the second-second signal received from each of the plurality of first sensors 251 to 255, using the first code. For example, the first electronic device 401 may receive the second-first signal generated from the sensor 252 by the first magnetic field and the second-second signal generated from the sensor 252 by the second magnetic field, from the sensor 252. The first electronic device 401 may detect the second-first signal corresponding to the first-first signal, based on the correlation value (or correlation function) between the first-first signal modulated based on the first code and each of the second-first signal and the second-second signal. According to an embodiment of the disclosure, the correlation value (e.g., the maximum value of the correlation function) between the second-first signal and the first-first signal may be not less than a predetermined value, and the correlation value between the second-second signal and the first-first signal may be less than a predetermined value.

According to an embodiment of the disclosure, the second electronic device 403 may detect the second-fourth signal among the second-third signal and the second-fourth signal received from each of the plurality of second sensors 256 to 260, using the second code. According to an embodiment of the disclosure, the second electronic device 403 may detect the second-fourth signal (e.g., the second-fourth signal generated by the second magnetic field) corresponding to the first-second signal generated by the second magnetic field generator 242 among the second-third signal and the second-fourth signal received from each of the plurality of second sensors 256 to 260, using the second code.

According to an embodiment of the disclosure, the first electronic device 401 may obtain the posture (e.g., at least one of the position or direction) for each of the plurality of first sensors 251 to 255, based on the second-first signal. For example, the first electronic device 401 may obtain the position of the sensor 252 (e.g., the position of the sensor 252 relative to the position of the first magnetic field generator 241) and the direction of the sensor 252 (e.g., the direction of the sensor 252 relative to the direction of the first magnetic field generator 241), based on the second-first signal received from the sensor 252.

According to an embodiment of the disclosure, the second electronic device 403 may obtain the posture (e.g., at least one of the position or direction) for each of the plurality of second sensors 256 to 260, based on the second-fourth signal.

A method for obtaining the posture of each of the plurality of first sensors 251 to 255 and each of the plurality of second sensors 256 to 260 is described below with reference to FIG. 8.

As in the above-described examples, the electronic device 101 may obtain the posture of the sensor 240 based only on the signal induced by the sensor 240 connected with the electronic device 101 by the magnetic field generated by the magnetic field generator 230 connected with the electronic device 101, thereby providing more accurate information about the posture of the sensor 240.

According to an embodiment of the disclosure, the processor 220 may provide 3D input based on the code corresponding to the sensor 240 connected with the electronic device 101. A method for providing 3D input based on the code corresponding to the sensor 240 is described below with reference to FIG. 5.

Figure 5:
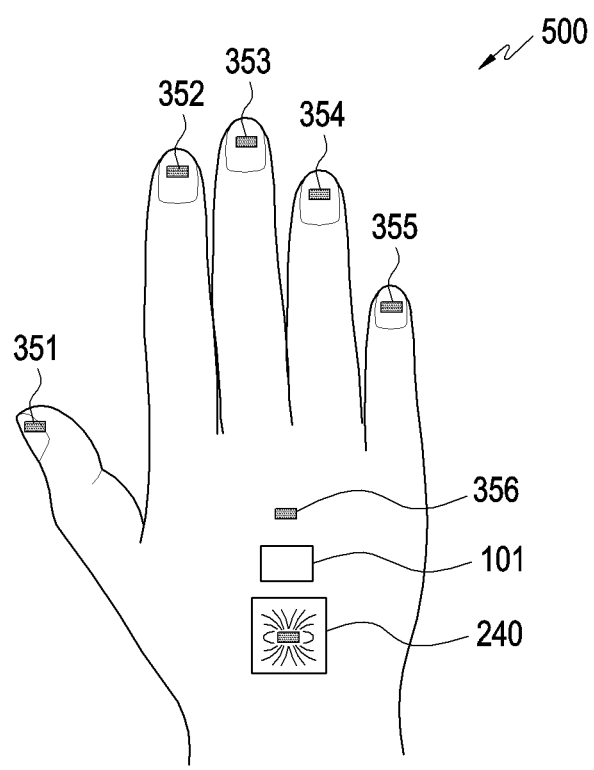
FIG. 5 is a view illustrating a method for providing 3D input according to an embodiment of the disclosure.

FIG. 5 is a view 500 illustrating a method for providing 3D input according to an embodiment of the disclosure.

Referring to FIG. 5, according to an embodiment of the disclosure, the processor 220 may configure (e.g., generate) a code for each of a plurality of sensors 351 to 356. Sensors 351 to 355 among the plurality of sensors 351 to 356 may be placed on the user's finger tips, and the sensor 356 may be placed on the user's back of hand. The positions of the plurality of sensors 351 to 356 are not limited thereto.

For example, Table 1 below may show the code corresponding to each of the plurality of sensors 351 to 356.

TABLE 1

| sensor 240 | code corresponding to sensor 240 |
|---|---|
| sensor 1 (351) | 0010101101111011001100100011001 |
| sensor 2 (352) | 0100100101110100110110000110111 |
| sensor 3 (353) | 0101110001011010011011110010100 |
| sensor 4 (354) | 1100110010011111000111000101001 |
| sensor 5 (355) | 1010011000101011101010111010100 |
| sensor 6 (356) | 1110011001101010111010101110101 |

Referring to Table 1, the processor 220 may configure (e.g., generate) a different code for each of a plurality of sensors 351 to 356.

According to an embodiment of the disclosure, although such an example is described where the length of the code corresponding to the sensor 240 corresponds to 31 bits, embodiments of the disclosure are not limited thereto.

According to an embodiment of the disclosure, the processor 220 may configure a code with a different length for each of the plurality of sensors 351 to 356. For example, the processor 220 may configure a code, whose length corresponds to 31 bits, for sensor 1 351 and a code, whose length corresponds to 40 bits, for sensor 2 352. According to an embodiment of the disclosure, when the processor 220 increases the length of the code (e.g., increases the numbers of the bits corresponding to the code length), the processor 220 may enable the magnetic field generator 230 to radiate magnetic field at lower power. For example, the distances between the plurality of sensors 351 to 356 of the magnetic field generator 230 may differ from each other. When the processor 220 increases the code length, the processor 220 may increase the range of the magnetic field (e.g., the distance at which the magnetic field may reach) radiated from the magnetic field generator 230. For example, when the processor 220 allows the magnetic field generator 230 to radiate magnetic field at constant power in the electronic device 101, the processor 220 may configure a longer code for the sensor positioned farther away than the other sensors so that the sensor positioned farther away than the other sensors may receive a magnetic field whose magnitude is larger than a predetermined magnitude.

According to an embodiment of the disclosure, the processor 220 may generate the first signal by modulating the phase of the default signal using the code configured for each of the plurality of sensors 351 to 356. For example, the processor 220 may generate the first-first signal by modulating the phase of the default signal using the first code corresponding to sensor 1 351. The processor 220 may generate the first-second signal by modulating the phase of the default signal using the second code corresponding to sensor 2 352.

According to an embodiment of the disclosure, the processor 220 may control the magnetic field generator 230 to sequentially radiate magnetic fields corresponding to the phase-modulated first signal. For example, the processor 220 may control the magnetic field generator 230 to radiate the magnetic field corresponding to the first-second signal, a predetermined time after radiating the magnetic field corresponding to the first-first signal.

According to an embodiment of the disclosure, the processor 220 may receive the second signal (e.g., a signal induced by the magnetic field corresponding to the first signal) (e.g., a voltage induced from the sensor by the magnetic field corresponding to the first signal) corresponding to the first signal from each of the plurality of sensors 351 to 356 and identify the second signal using the code corresponding to each of the plurality of sensors 351 to 356.

According to an embodiment of the disclosure, the processor 220 may modulate each of the plurality of received second signals using the code corresponding to each of the plurality of sensors 351 to 356, thereby identifying the sensor which has transferred each of the plurality of second signals. For example, the processor 220 may detect the second-first signal (induced from sensor 1 by the magnetic field corresponding to the first-first signal) corresponding to the first-first signal from the signal received from sensor 1 351, using the first code corresponding to sensor 1 351. As another example, the processor 220 may detect the second-second signal (induced from sensor 2 by the magnetic field corresponding to the first-second signal) corresponding to the first-second signal from the signal received from sensor 2 352, using the second code corresponding to sensor 2 352.

According to an embodiment of the disclosure, the processor 220 may obtain the posture (e.g., at least one of the position or direction) for each of the plurality of first sensors 351 to 356, based on the second signal. For example, the processor 220 may obtain the position of sensor 1 351 (e.g., the position of sensor 1 351 relative to the position of the magnetic field generator 230) and the direction of sensor 1 351 (e.g., the direction of sensor 1 351 relative to the direction of the magnetic field generator 230), based on the second-first signal received from sensor 1 351.

A method for obtaining the position and direction of the sensor 240 based on the second signal is described below with reference to FIGS. 6 to 8.

FIG. 6 is a view 600 illustrating a code and a first signal according to an embodiment of the disclosure.

Figure 7:
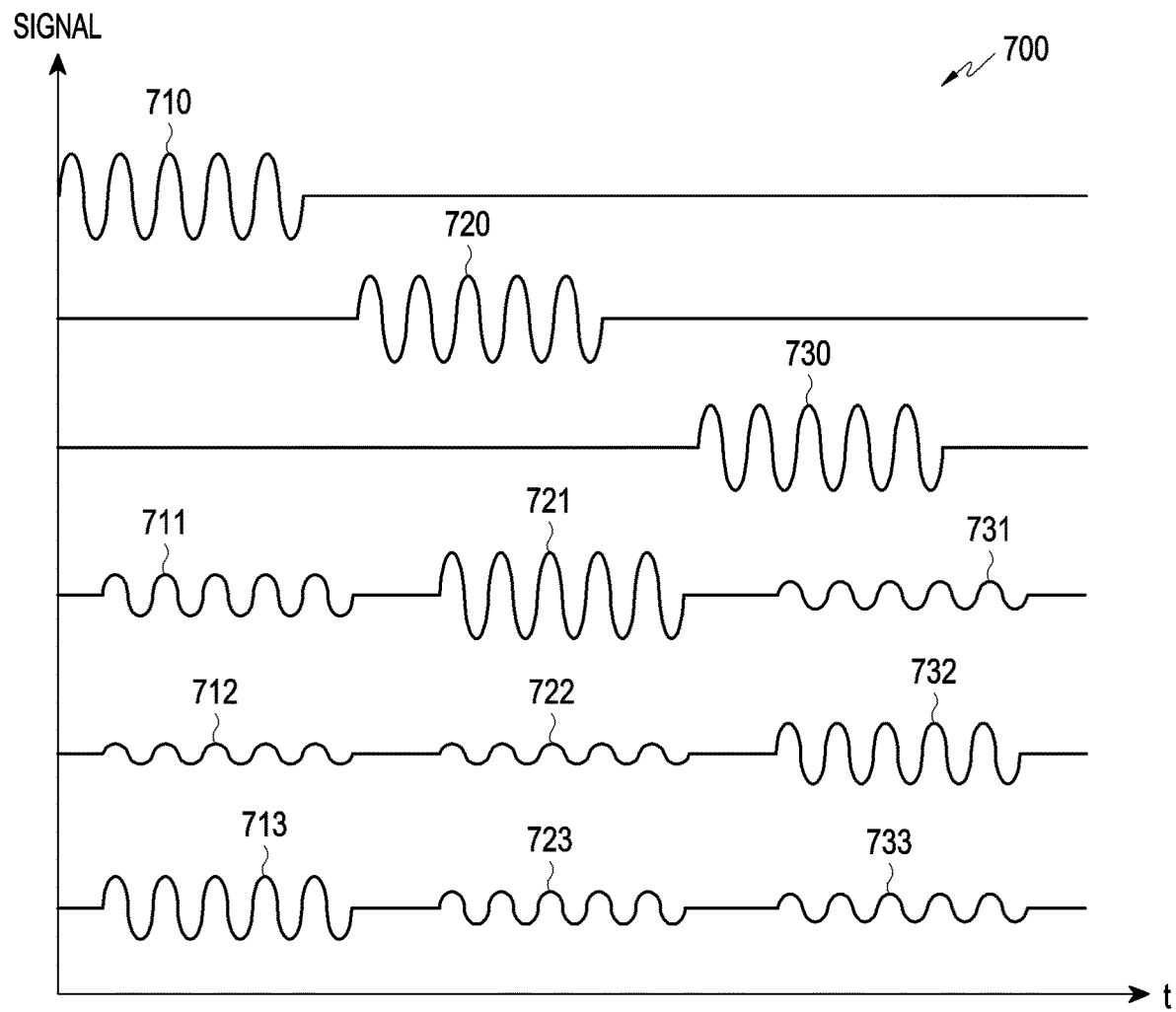
FIG. 7 is a view illustrating a first signal and a second signal according to an embodiment of the disclosure.

FIG. 7 is a view 700 illustrating a first signal and a second signal according to an embodiment of the disclosure.

Figure 8:
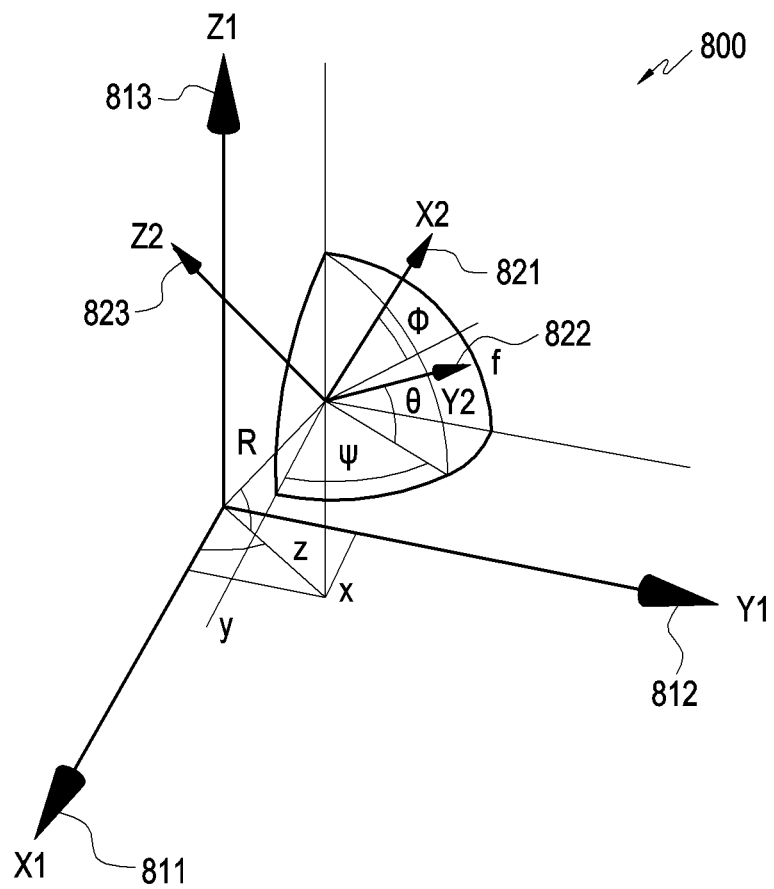
FIG. 8 is a view illustrating a method for determining a sensor's posture according to an embodiment of the disclosure.

FIG. 8 is a view 800 illustrating a method for determining the posture of the sensor 240 according to an embodiment of the disclosure.

Referring to FIGS. 6 to 8, according to various embodiments of the disclosure, 610 may be a graph indicating a configured (e.g., generated) code (pseudo-random sequence). For example, the processor 220 may generate a signal 611 (v(t)) by matching the bit '1' to '1' and the bit '0' to '−1' for the code including the bits of '1' and '0' so as to modulate the phase of the default signal.

According to an embodiment of the disclosure, 620 may denote the first signal 621 (s(t)) generated by modulating the default signal using the code. For example, the processor 220 may generate the first signal 621 by shifting the phase of the default signal by $\pi(180°)$ and $-\pi(-180°)$ using the '1' values and the '−1' values.

According to an embodiment of the disclosure, the first signal 621 may be expressed as in Equation 1 below.

$$s(t) = U \cos(\omega t - \varphi - \pi \cdot v(t)) \qquad \text{Equation 1}$$

In Equation 1, U may denote the magnitude of the first signal 621, $\varphi$ may denote the random phase, and v(t) may denote the code.

According to an embodiment of the disclosure, in FIG. 7, the signals 710, 720, and 730 may denote the first signals radiated from the three coils orthogonal to one another, included in the magnetic field generator 230. For example, among the three coils orthogonal to one another, included in the magnetic field generator 230, the signal 710 may denote the signal radiated from the coil having the X1 axis 811, the signal 720 may denote the signal radiated from the coil having the Y1 axis 812, and the signal 730 may denote the signal radiated from the coil having the Z1 axis 813.

According to an embodiment of the disclosure, the processor 220 may control the magnetic field generator 230 to sequentially radiate the signal 710, the signal 720, and the signal 730.

According to an embodiment of the disclosure, the signals 711, 712, and 713 may be signals induced by the signal 710 in one sensor 240. For example, in the sensor 240 having three coils orthogonal to one another, the signal 711 may denote the signal induced by the coil of the sensor 240, which has the X2 axis 821, by the signal 710, the signal 712 may denote the signal induced by the coil of the sensor 240, which has the Y2 axis 822, by the signal 710, and the signal 713 may denote the signal induced by the coil of the sensor 240, which has the Z2 axis 823, by the signal 710. As another example, in the sensor 240 having three coils orthogonal to one another, the signal 721 may denote the signal induced by the coil of the sensor 240, which has the X2 axis 821, by the signal 720, the signal 722 may denote the signal induced by the coil of the sensor 240, which has the Y2 axis 822, by the signal 720, and the signal 723 may denote the signal induced by the coil of the sensor 240, which has the Z2 axis 823, by the signal 720. As another example, in the sensor 240 having three coils orthogonal to one another, the signal 731 may denote the signal induced by the coil of the sensor 240, which has the X2 axis 821, by the signal 730, the signal 732 may denote the signal induced by the coil of the sensor 240, which has the Y2 axis 822, by the signal 730, and the signal 733 may denote the signal induced by the coil of the sensor 240, which has the Z2 axis 823, by the signal 730.

According to an embodiment of the disclosure, the signal 710, the signal 720, and the signal 730 may be expressed as in Equation 2 below.

$$s_x(t)=U_x \cdot \cos(\omega \cdot t - \varphi_x - \pi \cdot v(t)) \; s_y(t)=U_y \cdot \cos(\omega \cdot t - \varphi_y - \pi \cdot v(t)) \; s_z(t)=U_z \cdot \cos(\omega \cdot t - \varphi_z - \pi \cdot v(t))$$
Equation 2

In Equation 2, $s_x(t)$, $s_y(t)$, and $s_z(t)$ may denote the signal 710, the signal 720, and the signal 730, respectively.

According to an embodiment of the disclosure, the signal 711, the signal 712, and the signal 713 may be expressed as in Equation 3 below.

$$s_x^x(t)=U_x^x \cdot \cos(\omega \cdot t - \varphi_x^x - \pi \cdot v(t)) \; s_x^y(t)=U_x^y \cdot \cos(\omega \cdot t - \varphi_x^y - \pi \cdot v(t)) \; s_x^z(t)=U_x^z \cdot \cos(\omega \cdot t - \varphi_x^z - \pi \cdot v(t))$$
Equation 3

According to an embodiment of the disclosure, the signal 721, the signal 722, and the signal 723 may be expressed as in Equation 4 below.

$$s_y^x(t)=U_y^x \cdot \cos(\omega \cdot t - \varphi_y^x - \pi \cdot v(t)) \; s_y^y(t)=U_y^y \cdot \cos(\omega \cdot t - \varphi_y^y - \pi \cdot v(t)) \; s_y^z(t)=U_y^z \cdot \cos(\omega \cdot t - \varphi_y^z - \pi \cdot v(t))$$
Equation 4

According to an embodiment of the disclosure, the signal 731, the signal 732, and the signal 733 may be expressed as in Equation 5 below.

$$s_z^x(t)=U_z^x \cdot \cos(\omega \cdot t - \varphi_z^x - \pi \cdot v(t)) \; s_z^y(t)=U_z^y \cdot \cos(\omega \cdot t - \varphi_z^y - \pi \cdot v(t)) \; s_z^z(t)=U_z^z \cdot \cos(\omega \cdot t - \varphi_z^z - \pi \cdot v(t))$$
Equation 5

According to an embodiment of the disclosure, Equation 2 may be represented as a matrix as shown in Equation 6 below.

$$S_{tr} = \begin{bmatrix} U_x \cdot \cos(\omega \cdot t - \varphi_x - \pi \cdot v(t)) \\ U_y \cdot \cos(\omega \cdot t - \varphi_y - \pi \cdot v(t)) \\ U_z \cdot \cos(\omega \cdot t - \varphi_z - \pi \cdot v(t)) \end{bmatrix}$$
Equation 6

According to an embodiment of the disclosure, Equations 3 to 5 may be represented as a matrix as shown in Equation 7 below.

$$S_{rv} = \begin{bmatrix} s_x^x(t) & s_y^x(t) & s_z^x(t) \\ s_x^y(t) & s_y^y(t) & s_z^y(t) \\ s_x^z(t) & s_y^z(t) & s_z^z(t) \end{bmatrix}$$
Equation 7

According to an embodiment of the disclosure, the processor 220 may obtain a coupling coefficient based on the first signal and the second signal. For example, the processor 220 may obtain a coupling coefficient between the first signal and the second signal as shown in Equation 8, based on Equations 6 and 7.

$$Y = S_{rv} \cdot S_{tr}^{-1} = \begin{bmatrix} a_1 & a_2 & a_3 \\ b_1 & b_2 & b_3 \\ c_1 & c_2 & c_3 \end{bmatrix}$$
Equation 8

In Equation 8, $a_1$ to $c_3$ may denote the coupling coefficients.

According to an embodiment of the disclosure, the processor 220 may obtain the direction of the sensor 240, relative to the magnetic field generator 230, based on the coupling coefficient of Equation 8. For example, the processor 220 may obtain the direction of the sensor 240 relative to the magnetic field generator 230, as shown in Equation 13, using Equations 9 to 12.

$$D^2 = \frac{1}{C^2} \cdot Y^T \cdot Y$$
Equation 9

In Equation 9, $$C = \frac{1}{R^2},$$

and R may denote the total of the elements of $S_{rv}$.

$$D^{-1} = (D^2)^{\frac{-1}{2}} = \left(\sqrt{\frac{1}{C^2} \cdot Y^T \cdot Y}\right)^{-1}$$
Equation 10

$$A = \frac{1}{C} \cdot Y \cdot D^{-1} \cdot T_c$$
Equation 11

In Equation 11, $T_c$ may denote the compensation rotation matrix.

$$A = \begin{bmatrix} \cos(\psi)\cos(\theta) & \sin(\psi)\cos(\theta) & -\sin(\theta) \\ \cos(\psi)\sin(\theta) & \sin(\psi)\sin(\theta) & \\ \sin(\varphi) - & \sin(\varphi) + & \cos(\psi)\sin(\varphi) \\ \sin(\psi)\cos(\varphi) & \cos(\psi)\cos(\varphi) & \\ \cos(\psi)\sin(\theta) & \sin(\psi)\sin(\theta) & \\ \cos(\varphi) + & \cos(\varphi) - & \cos(\psi)\cos(\varphi) \\ \sin(\psi)\sin(\varphi) & \cos(\psi)\sin(\varphi) & \end{bmatrix}$$
Equation 12

$$\varphi = \arctan\left(\frac{A_{23}}{A_{33}}\right)$$
Equation 13

$$\psi = \arctan\left(\frac{A_{12}}{A_{11}}\right)$$

$$\theta = \arctan\left(\frac{-A_{13}}{\frac{A_{11}}{\cos(\psi)}}\right)$$

In Equation 13, Ψ, θ, and φ may denote the azimuth angle, the elevation angle, and the roll angle, respectively.

According to an embodiment of the disclosure, the processor 220 may obtain the distance between the magnetic field generator 230 and the sensor 240.

For example, the processor 220 may obtain the distance between the sensor 240 and the magnetic field generator 230, as shown in Equation 16, using Equations 14 and 15.

$$R = (KG_T G_r G^{-1})^{\frac{1}{3}} \quad \text{Equation 14}$$

In Equation 14, R may denote the distance between the magnetic field generator 230 and the sensor 240, K may denote the fixed system gain constant, $G_T$ and $G_r$, respectively, may denote the gains of the magnetic field generator 230 and the sensor 240 set by the automatic gain control function. $G^{-1}$ may be obtained by Equation 15 below.

$$G^{-1} = \sqrt{\frac{1 + 3(U_1 S_{tr1} + U_2 S_{tr2} + U_3 S_{tr3})^2}{S_{rv_1}^2 + S_{rv_2}^2 + S_{rv_3}^2}} \quad \text{Equation 15}$$

$$x = R \times U_1 \quad \text{Equation 16}$$
$$y = R \times U_2$$
$$z = R \times U_3$$

In Equation 16, $U_1$, $U_2$, and $U_3$ may denote the vectors indicating the directions along x, y, and z axes, respectively.

According to an embodiment of the disclosure, the processor 220 may obtain information having six degrees of freedom, such as (x, y, z, Ψ, θ, φ). For example, the processor 220 may obtain the positions and directions between the magnetic field generator 230 and the sensor 240.

Although in the above-described method, at least one of the position or direction of one sensor 240 among the plurality of sensors, relatively to the magnetic field generator 230 is obtained by Equations 1 to 16, the same method may be applied to each of the plurality of sensors so as to obtain at least one of the position or direction of each of the plurality of sensors, relative to the magnetic field generator 230.

According to an embodiment of the disclosure, although FIG. 2 illustrates that the electronic device 101 includes the memory 210 and the processor 220, the electronic device 101 may further include the components of FIG. 1. For example, the electronic device 101 may further include a communication module (e.g., the communication module 190) for transmitting information about at least one of the position or direction of each of the plurality of sensors to another electronic device.

Figure 9:
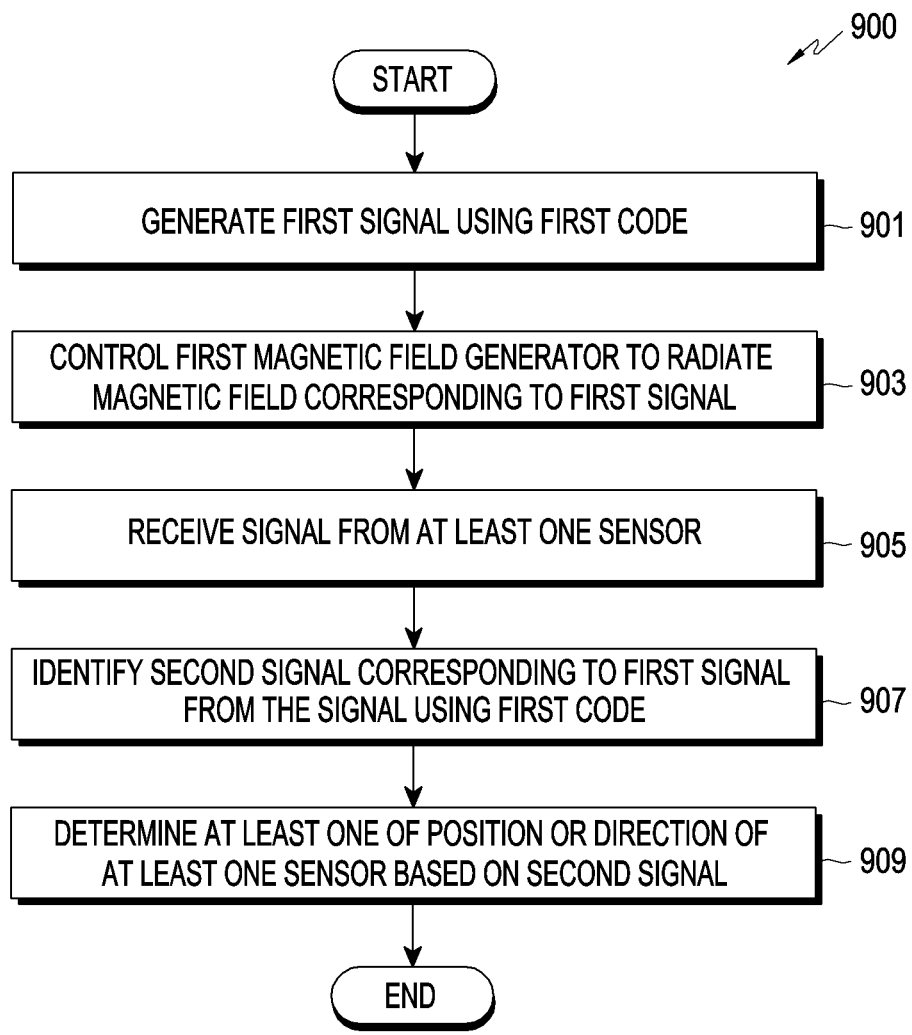
FIG. 9 is a flowchart illustrating a method for providing 3D input according to an embodiment of the disclosure.

FIG. 9 is a flowchart 900 illustrating a method for providing 3D input according to an embodiment of the disclosure.

Referring to FIG. 9, according to an embodiment of the disclosure, in operation 901, the processor 220 may generate the first signal by modulating the phase of the default signal, using the first code corresponding to the first magnetic field generator (e.g., the magnetic field generator 230) connected with the electronic device 101.

According to an embodiment of the disclosure, the electronic device 101 may be wiredly connected with the first magnetic field generator (e.g., the magnetic field generator 230). For example, the electronic device 101 may be connected with the first magnetic field generator via a cable. However, without limitations thereto, the first magnetic field generator may be wirelessly connected with the electronic device 101.

According to an embodiment of the disclosure, the processor 220 may generate the first code corresponding to the first magnetic field generator. According to an embodiment of the disclosure, the processor 220 may generate, in real-time, the first code corresponding to the first magnetic field generator. According to an embodiment of the disclosure, the processor 220 may store the generated first code in the memory 210.

According to an embodiment of the disclosure, when the first magnetic field generator is connected with the electronic device 101, the processor 220 may generate the first code corresponding to the first magnetic field generator. According to an embodiment of the disclosure, in response to detection of connection of the first magnetic field generator to the electronic device 101, the processor 220 may generate the first code corresponding to the first magnetic field generator.

According to an embodiment of the disclosure, the first code may denote a pseudo-random sequence used to modulate a signal in a direct sequence spread spectrum (DSSS) scheme.

According to an embodiment of the disclosure, the processor 220 may modulate the phase of the default signal (e.g., a signal of harmonic oscillation) using a BPSK scheme, using the first code. For example, the processor 220 may shift (or transition) the phase of the default signal for the bits of '1' of the first code by π(180°) and shift (or transition) the phase of the default signal for the bits of '0' of the code by −π(−180°).

According to an embodiment of the disclosure, the processor 220 may convert the first signal, which is a digital signal, into an analog first signal via a digital-analog converter (DAC). According to an embodiment of the disclosure, the processor 220 may amplify the analog first signal via an amplifier.

In operation 903, according to an embodiment of the disclosure, the processor 220 may control the first magnetic field generator (e.g., the magnetic field generator 230) to radiate the magnetic field corresponding to the first signal.

According to an embodiment of the disclosure, the processor 220 may transfer the first signal to the first magnetic field generator. According to an embodiment of the disclosure, the first magnetic field generator may radiate the magnetic field corresponding to the first signal.

In operation 905, according to an embodiment of the disclosure, the processor 220 may receive signals from at least one sensor (e.g., the sensor 240).

According to an embodiment of the disclosure, the electronic device 101 may be connected with at least one sensor. For example, the electronic device 101 may be wiredly connected with at least one sensor.

According to an embodiment of the disclosure, the processor 220 may receive, from at least one sensor, a signal including the second signal generated (e.g., induced) by the magnetic field corresponding to the first signal. According to an embodiment of the disclosure, as the at least one sensor receives the magnetic field generated from the magnetic field generator, the sensor may generate a magnetic field-related second signal (or a magnetic field-related parameter). For example, the at least one sensor may generate a voltage (or current) induced by the magnetic field generated from the magnetic field generator. The at least one sensor may transfer the generated, induced voltage to the electronic device 101.

In operation 907, according to an embodiment of the disclosure, the processor 220 may identify the second signal corresponding to the first signal, from the received signal, using the first code.

According to an embodiment of the disclosure, the processor 220 may detect the second signal (e.g., the second signal induced from at least one sensor by the first signal) corresponding to the first signal generated by the first magnetic field generator, among the signals received form the at least one sensor, using the first code. For example, the processor 220 may receive the second-first signal induced from the sensor 252, by the first magnetic field, and the second-second signal induced from the sensor 252, by the second magnetic field generated by another magnetic field generator, from the sensor 252. The processor 220 may detect the second-first signal corresponding to the first-first signal, based on the correlation value (or correlation function) between the first-first signal modulated based on the first code and each of the second-first signal and the second-second signal. According to an embodiment of the disclosure, the correlation value (e.g., the maximum value of the correlation function) between the second-first signal and the first-first signal may be not less than a predetermined value, and the correlation value between the second-second signal and the first-first signal may be less than a predetermined value.

In operation 909, according to an embodiment of the disclosure, the processor 220 may determine at least one of the position or direction of at least one sensor, based on the second signal. For example, the processor 220 may obtain at least one of the position or direction of the sensor, relative to the first magnetic field generator (e.g., the magnetic field generator 230) of each of the at least one sensor, using Equations 1 to 16 described above.

Figure 10:
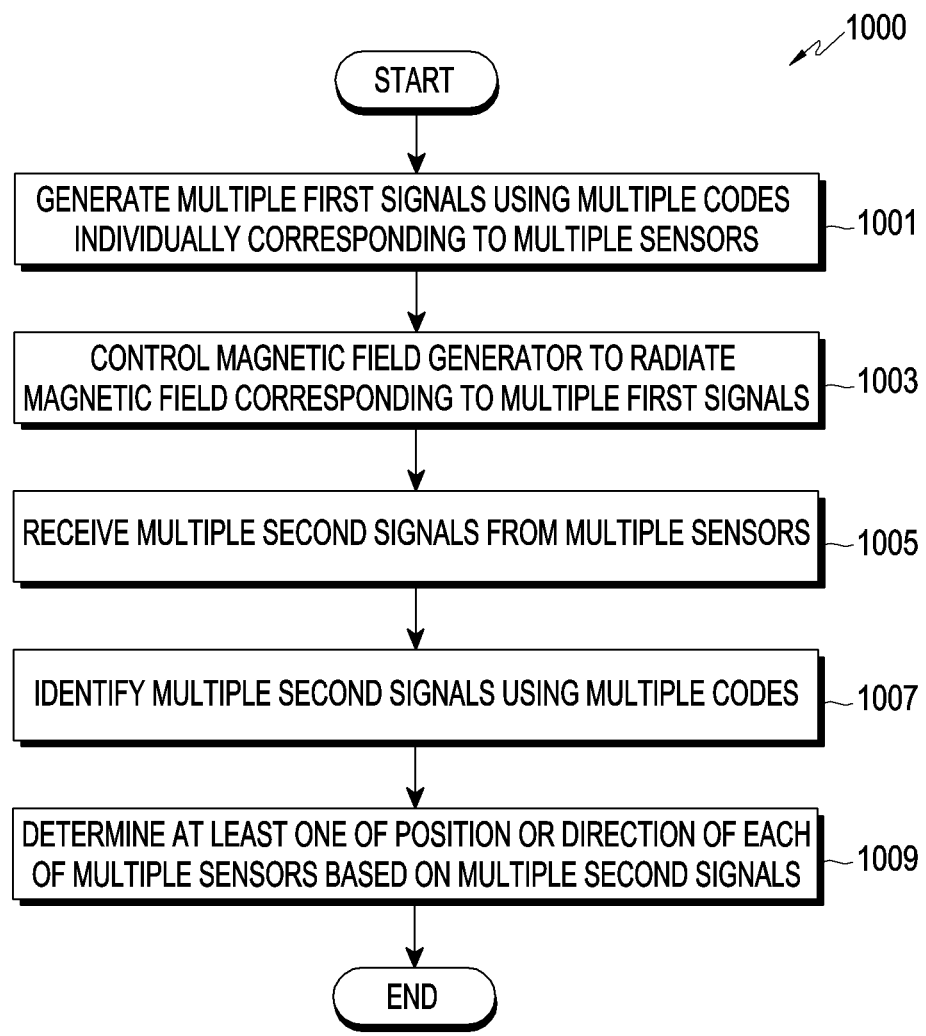
FIG. 10 is a flowchart illustrating a method for providing 3D input according to an embodiment of the disclosure.

FIG. 10 is a flowchart 1000 illustrating a method for providing 3D input according to an embodiment of the disclosure.

Referring to FIG. 10, according to an embodiment of the disclosure, in operation 1001, the processor 220 may generate a plurality of first signals using a plurality of codes individually corresponding to a plurality of sensors.

According to an embodiment of the disclosure, the processor 220 may configure (e.g., generate) a different code for each of a plurality of sensors. For example, the processor 220 may configure a plurality of codes individually corresponding to the plurality of sensors, as shown in Table 1 described above.

According to an embodiment of the disclosure, the processor 220 may configure a code with a different length for each of the plurality of sensors. For example, the processor 220 may configure a code, whose length corresponds to 31 bits, for sensor 1 and a code, whose length corresponds to 40 bits, for sensor 2. According to an embodiment of the disclosure, when the processor 220 increases the length of the code (e.g., increases the numbers of the bits corresponding to the code length), the processor 220 may enable the magnetic field generator 230 to radiate magnetic field at lower power. For example, the distances between the plurality of sensors of the magnetic field generator 230 may differ from each other. When the processor 220 increases the code length, the processor 220 may increase the range of the magnetic field (e.g., the distance at which the magnetic field may reach) radiated from the magnetic field generator 230. For example, when the processor 220 allows the magnetic field generator 230 to radiate magnetic field at constant power in the electronic device, the processor 220 may configure a longer code for the sensor positioned farther away than the other sensors so that the sensor positioned farther away than the other sensors may receive a magnetic field whose magnitude is larger than a predetermined magnitude.

According to an embodiment of the disclosure, the processor 220 may generate the first signal by modulating the phase of the default signal using the code configured for each of the plurality of sensors. For example, the processor 220 may generate the first-first signal by modulating the phase of the default signal using the first code corresponding to sensor 1. The processor 220 may generate the first-second signal by modulating the phase of the default signal using the second code corresponding to sensor 2.

In operation 1003, according to an embodiment of the disclosure, the processor 220 may control the magnetic field generator 230 to radiate the magnetic fields corresponding to the plurality of first signals.

According to an embodiment of the disclosure, the processor 220 may control the magnetic field generator 230 to sequentially radiate magnetic fields corresponding to the phase-modulated first signal. For example, the processor 220 may control the magnetic field generator 230 to radiate the magnetic field corresponding to the first-second signal, a predetermined time after radiating the magnetic field corresponding to the first-first signal.

In operation 1005, according to an embodiment of the disclosure, the processor 220 may receive a plurality of second signals from the plurality of sensors. According to an embodiment of the disclosure, the processor 220 may receive the second signal (e.g., a signal induced by the magnetic field corresponding to the first signal) (e.g., a voltage induced from the sensor by the magnetic field corresponding to the first signal) corresponding to the first signal from each of the plurality of sensors.

In operation 1007, the processor 220 may identify the second signal using the code corresponding to each of the plurality of sensors. According to an embodiment of the disclosure, the processor 220 may modulate each of the plurality of received second signals using the code corresponding to each of the plurality of sensors, thereby identifying the sensor which has transferred each of the plurality of second signals. For example, the processor 220 may detect the second-first signal (induced from sensor 1 by the magnetic field corresponding to the first-first signal) corresponding to the first-first signal from the signal received from sensor 1, using the first code corresponding to sensor 1. As another example, the processor 220 may detect the second-second signal (induced from sensor 2 by the magnetic field corresponding to the first-second signal) corresponding to the first-second signal from the signal received from sensor 2, using the second code corresponding to sensor 2.

In operation 1009, according to an embodiment of the disclosure, the processor 220 may determine the posture (e.g., at least one of the position or direction) for each of the plurality of first sensors, based on the second signal. For example, the processor 220 may obtain the position of sensor 1 (e.g., the position of sensor 1 relative to the position of the magnetic field generator 230) and the direction of sensor 1 (e.g., the direction of sensor 1 relative to the direction of the magnetic field generator 230), based on the second-first signal received from sensor 1.

Figure 11:
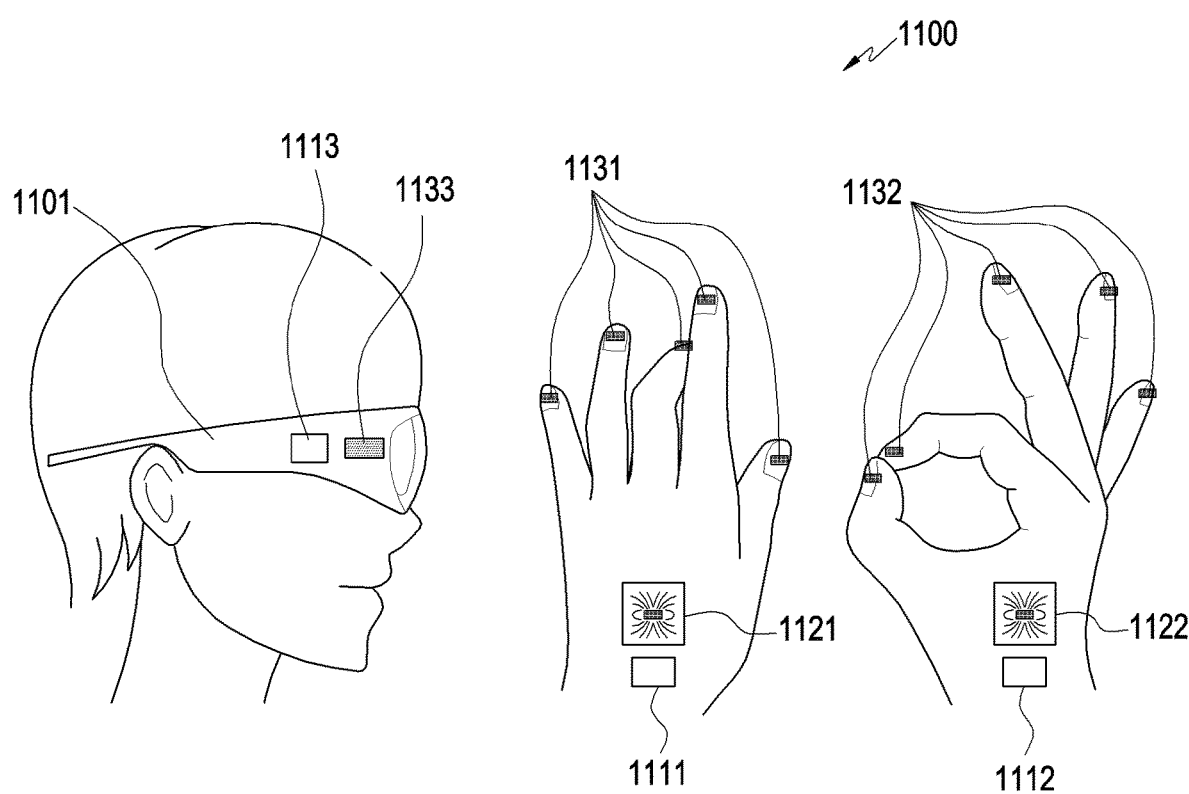
FIG. 11 is a view illustrating a method for providing 3D input according to an embodiment of the disclosure.

FIG. 11 is a view 1100 illustrating a method for providing 3D input according to an embodiment of the disclosure.

Referring to FIG. 11, according to an embodiment of the disclosure, a first electronic device 1111 may be connected with a first magnetic field generator 1121 and a plurality of first sensors 1131. For example, the first electronic device 1111 may be wiredly connected with the first magnetic field generator 1121 and the plurality of first sensors 1131.

According to an embodiment of the disclosure, a second electronic device 1112 may be connected with the first magnetic field generator 1121 and a plurality of second sensors 1132.

According to an embodiment of the disclosure, the first electronic device 1111, the first magnetic field generator 1121, and the plurality of first sensors 1131 may be placed on the user's left hand (e.g., the fingertips of the left hand) According to an embodiment of the disclosure, the second electronic device 1112, the second magnetic field generator 1122, and the plurality of second sensors 1132 may be placed on the user's right hand.

According to an embodiment of the disclosure, a third electronic device 1113 may be placed in an augmented reality (AR) device 1101 (or a virtual reality (VR) device). According to an embodiment of the disclosure, the third electronic device 1113 may be included in the AR device 1101. According to an embodiment of the disclosure, the third electronic device 1113 may be wiredly connected with the third sensor 1133. For example, the third electronic device 1113 may be wiredly connected with a plurality of third sensors (e.g., two third sensors). According to an embodiment of the disclosure, the third electronic device 1113 may be wirelessly connected with the first electronic device 1111 and the second electronic device 1112.

According to an embodiment of the disclosure, the first electronic device 1111 may control the first magnetic field generator 1121 to generate a first-first signal using the first code corresponding to the first magnetic field generator 1121 and to generate a first magnetic field corresponding to the first-first signal. According to an embodiment of the disclosure, the second electronic device 1112 may control the second magnetic field generator 1122 to generate the second magnetic field corresponding to the first-second signal using the second code corresponding to the second magnetic field generator 1122. According to an embodiment of the disclosure, the first magnetic field and the second magnetic field may be simultaneously generated from the first magnetic field generator 1121 and the second magnetic field generator 1122.

According to an embodiment of the disclosure, each of the plurality of first sensors 1131 may generate the second-first signal induced by the first magnetic field and the second-second signal induced by the second magnetic field and transfer the generated second-first signal and second-second signal to the first electronic device 1111. According to an embodiment of the disclosure, each of the plurality of second sensors 1132 may generate the second-third signal induced by the first magnetic field and the second-fourth signal induced by the second magnetic field and transfer the generated second-third signal and second-fourth signal to the second electronic device 1112. According to an embodiment of the disclosure, the plurality of third sensors (e.g., the third sensor 1133) may generate the second-fifth signal induced by the first magnetic field and the second-sixth signal induced by the second magnetic field and transfer the generated second-fifth signal and second-sixth signal to the third electronic device 1113.

According to an embodiment of the disclosure, the first electronic device 1111 may identify the second-first signal corresponding to the first-first signal generated by the first magnetic field generator 1121 among the second-first signal and the second-second signal, using the first code. According to an embodiment of the disclosure, the second electronic device 1112 may identify the second-fourth signal corresponding to the first-second signal generated by the second magnetic field generator 1122 among the second-third signal and the second-fourth signal, using the second code. According to an embodiment of the disclosure, the third electronic device 1113 may identify the second-fifth signal induced by the first magnetic field and the second-sixth signal induced by the second magnetic field.

According to an embodiment of the disclosure, the first electronic device 1111 may transmit the second-first signal, corresponding to the generated first-first signal, to the third electronic device 1113. According to an embodiment of the disclosure, the second electronic device 1112 may transmit the second-fourth signal, corresponding to the generated first-second signal, to the third electronic device 1113.

According to an embodiment of the disclosure, the third electronic device 1113 may obtain at least one of the position or direction of the plurality of first sensors 1131, relative to the third sensor 1133 (e.g., one of two third sensors), based on the second-first signal and the second-fifth signal. The third electronic device 1113 may obtain at least one of the position or direction of the plurality of second sensors 1132, relative to the third sensor 1133 (e.g., the other of the two third sensors), based on the second-fourth signal and the second-sixth signal.

According to an embodiment of the disclosure, the third electronic device 1113 placed in the AR device 1101 may obtain at least one of the position or direction of the plurality of first sensors 1131 and the plurality of second sensors 1132, relative to the third sensor 1133, so that the AR device 1101 may use at least one of the position or direction, received from the plurality of first sensors 1131 and the plurality of second sensors 1132, as input to the AR device 1101. For example, the third electronic device 1113 may transfer at least one of the position or direction, received from the plurality of first sensors 1131 and the plurality of second sensors 1132, to the AR device 1101. As another example, at least one of the third electronic device 1113 or the third sensor 1133 may be a component of the AR device 1101.

Figure 12:
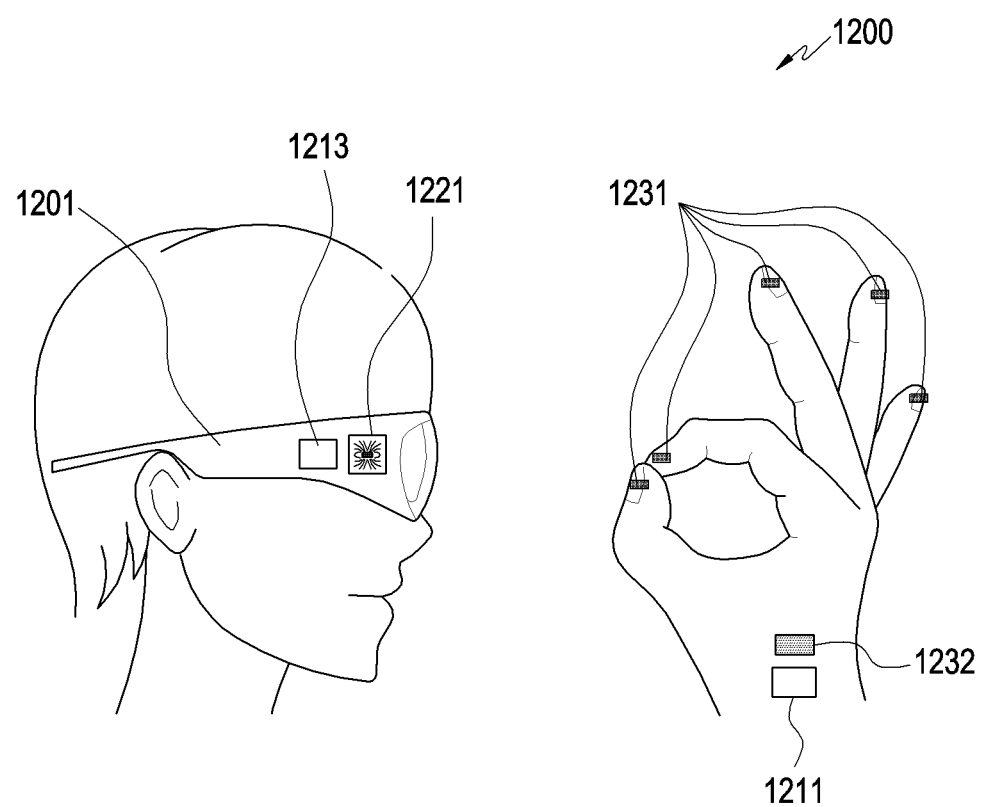
FIG. 12 is a view illustrating a method for providing 3D input according to an embodiment of the disclosure.

FIG. 12 is a view 1200 illustrating a method for providing 3D input according to an embodiment of the disclosure.

Referring to FIG. 12, according to an embodiment of the disclosure, a first electronic device 1213 may be connected with a magnetic field generator 1221. For example, the first electronic device 1213 may be wiredly connected with the magnetic field generator 1221. According to an embodiment of the disclosure, the first electronic device 1213 may be placed in an augmented reality (AR) device 1201 (or a virtual reality (VR) device). According to an embodiment of the disclosure, the first electronic device 1213 may be included in the AR device 1201.

According to an embodiment of the disclosure, a second electronic device 1211 may be wiredly connected with a plurality of sensors 1231 and 1232. According to an embodiment of the disclosure, the second electronic device 1211 may be placed on the user's hand (e.g., right hand).

According to an embodiment of the disclosure, the first electronic device 1213 may control the magnetic field generator 1221 to generate the magnetic field corresponding to the first signal.

According to an embodiment of the disclosure, the second electronic device 1211 may receive the second signals induced by the plurality of sensors 1231 and 1232 from the plurality of sensors 1231 and 1232. The second electronic device 1211 may transmit the received second signal to the first electronic device 1213 via a communication module.

According to an embodiment of the disclosure, the first electronic device 1213 may obtain at least one of the position or direction of each of the plurality of sensors 1231 and 1232, relative to the magnetic field generator 1221, based on the received second signal.

According to an embodiment of the disclosure, the second electronic device 1211 placed in the AR device 1201 may obtain at least one of the position or direction of each of the plurality of sensors 1231 and 1232, relative to the magnetic field generator 1221, so that the AR device 1201 may use at least one of the position or direction, received from the plurality of sensors 1231 and 1232, as input to the AR device 1201.

Figure 13:
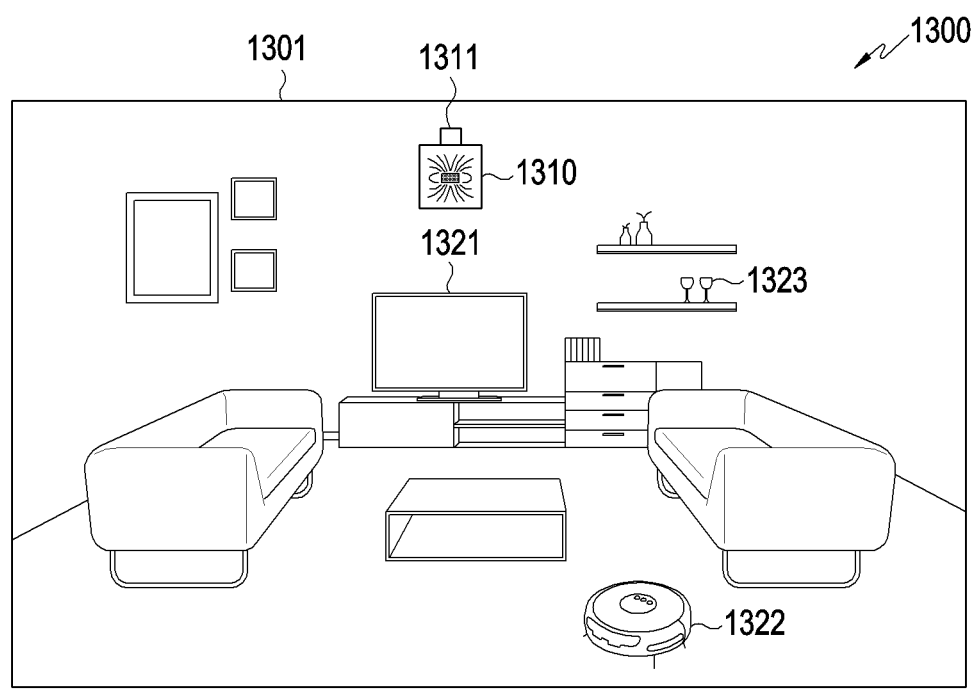
FIG. 13 is a view illustrating a method for providing 3D input according to an embodiment of the disclosure.

FIG. 13 is a view 1300 illustrating a method for providing 3D input according to an embodiment of the disclosure.

Referring to FIG. 13, according to an embodiment of the disclosure, a system for providing 3D input may be implemented in an indoor environment 1301.

According to an embodiment of the disclosure, an electronic device 1311 and a magnetic field generator 1310 may be placed on the ceiling of the indoor environment 1301.

According to an embodiment of the disclosure, a sensor (not shown) and an electronic device (not shown) may be placed in each of the things 1321, 1322, and 1323 included in the indoor environment 1301.

According to an embodiment of the disclosure, the electronic device 1311 may generate a first signal using a code. The electronic device 1311 may control the magnetic field generator 1310 to generate the magnetic field corresponding to the first signal.

According to an embodiment of the disclosure, when the sensor (not shown) in each of the things 1321, 1322, and 1323 generates a second signal induced by the magnetic field corresponding to the first signal, the sensor may transfer the generated second signal to the electronic device (not shown) of each thing 1321, 1322, and 1323 connected with the sensor. The electronic device (not shown) in each of the things 1321, 1322, and 1323 may transfer the generated second signal to the electronic device, and the electronic device 1311 may obtain at least one of the position or direction of each thing, relative to the magnetic field generator, based on the received second signal.

According to an embodiment of the disclosure, the electronic device 1311 may obtain at least one of the position or direction of each thing, relative to the magnetic field generator 1310, so that the electronic device 1311 may provide information about the posture (or movement) of each thing.

Further, the structure of the data used in embodiments of the disclosure may be recorded in a computer-readable recording medium via various means. The computer-readable recording medium includes a storage medium, such as a magnetic storage medium (e.g., a ROM, a floppy disc, or a hard disc) or an optical reading medium (e.g., a CD-ROM or a DVD).

As is apparent from the foregoing description, according to various embodiments of the disclosure, the method for providing 3D input and electronic device supporting the same may provide 3D input at low power using the signal modulated by a direct sequence spread spectrum (DSSS) method.

While the disclosure has been shown and descried with reference to various embodiments thereof, it will be understood by those skilled in the art that various changes in form and details may be made therein without departing from the spirit and scope of the disclosure as defined by the appended claims and their equivalents.

What is claimed is:
1. An electronic device comprising:
a memory; and
at least one processor functionally connected with the memory,
wherein the at least one processor is configured to:
generate a plurality of first signals by modulating a phase of a default signal using a plurality of first codes respectively corresponding to a plurality of first sensors connected with the electronic device, wherein lengths of the plurality of first codes are differently, by the at least one processor, set by distances between a magnetic field generator connected with the electronic device and each of plurality of first sensors, wherein the plurality of first codes are respectively unique to the plurality of the first sensors, the magnetic field generator being one magnetic field generator,
control the magnetic field generator to sequentially radiate a plurality of magnetic fields respectively corresponding to the plurality of first signals,
receive a plurality of second signals from the plurality of sensors,
identify, using the plurality of first codes, the plurality of second signals respectively corresponding to the plurality of first signals, based on correlation values between each of the plurality of second signals and each of the plurality of first signals, and
determine, based on the plurality of second signals, at least one of a position or a direction of each of the plurality of sensors,
wherein the at least one processor is further configured to set a second code having a first length to a first sensor and a third code having a second length longer than the first length to a second sensor, based on a first distance being less than a second distance, the first distance being a distance between the magnetic field generator and the first sensor, the second distance being a distance between the magnetic field generator and the second sensor, the first sensor and the second sensor being included in the plurality of first sensors, the second code and the third code being included in the plurality of first codes.
2. The electronic device of claim 1, wherein each of the plurality of first codes includes a pseudo-random sequence used to perform a direct sequence spread spectrum (DSSS) scheme.

* * * * *